(12) United States Patent
Duckworth et al.

(10) Patent No.: US 10,726,630 B1
(45) Date of Patent: Jul. 28, 2020

(54) METHODS AND SYSTEMS FOR PROVIDING A TUTORIAL FOR GRAPHIC MANIPULATION OF OBJECTS INCLUDING REAL-TIME SCANNING IN AN AUGMENTED REALITY

(71) Applicant: Capital One Services, LLC, McLean, VA (US)

(72) Inventors: Staevan Duckworth, Oak Point, TX (US); Daniel Martinez, Plano, TX (US); William Hardin, Dallas, TX (US); Victoria Blacksher, Plano, TX (US); Jonathan Castaneda, Plano, TX (US); Stewart Youngblood, Allen, TX (US)

(73) Assignee: Capital One Services, LLC, McLean, VA (US)

( * ) Notice: Subject to any disclaimer, the term of this patent is extended or adjusted under 35 U.S.C. 154(b) by 0 days.

(21) Appl. No.: 16/457,858

(22) Filed: Jun. 28, 2019

(51) Int. Cl.
| | |
|---|---|
| *G06T 19/00* | (2011.01) |
| *G06K 9/00* | (2006.01) |
| *G06T 15/50* | (2011.01) |
| *G06F 30/20* | (2020.01) |

(52) U.S. Cl.
CPC .......... *G06T 19/006* (2013.01); *G06F 30/20* (2020.01); *G06K 9/00671* (2013.01); *G06T 15/50* (2013.01); *G06T 2207/20081* (2013.01); *G06T 2207/20084* (2013.01)

(58) Field of Classification Search
CPC combination set(s) only.
See application file for complete search history.

(56) References Cited

U.S. PATENT DOCUMENTS

| | | | |
|---|---|---|---|
| 10,109,041 B2* | 10/2018 | Summers | G06Q 10/10 |
| 10,111,620 B2* | 10/2018 | Miller | A61B 5/6803 |
| 10,169,684 B1* | 1/2019 | Nathan | G06K 9/6276 |
| 10,284,794 B1* | 5/2019 | Francois | H04N 5/23238 |
| 10,339,721 B1* | 7/2019 | Dascola | G06F 1/1694 |
| 2010/0159434 A1* | 6/2010 | Lampotang | G09B 9/00 434/365 |
| 2015/0227557 A1* | 8/2015 | Holzschneider | G06F 16/51 382/218 |
| 2017/0084051 A1* | 3/2017 | Weising | G09G 5/08 |
| 2017/0103584 A1* | 4/2017 | Vats | G06T 19/20 |
| 2018/0012411 A1* | 1/2018 | Richey | G06T 7/73 |
| 2018/0033210 A1* | 2/2018 | Vats | G06F 3/0487 |
| 2018/0114334 A1* | 4/2018 | Desai | G06K 9/6259 |

(Continued)

*Primary Examiner* — Motilewa Good Johnson
(74) *Attorney, Agent, or Firm* — Finnegan, Henderson, Farabow, Garrett & Dunner, LLP

(57) ABSTRACT

A device including a storage medium storing instructions, and at least one processor configured to execute the stored instructions to perform operations is provided. The operations include displaying on a display screen an interactive scene containing an augmented reality element, receiving input to change display of the interactive scene, and receiving a request to simulate the capturing of image data representing the interactive scene. The operations further include determining a position of the augmented reality element relative to a region defined on the display screen, simulating the capturing of the image data representing the interactive scene, and providing, based on the determined position, an indication of whether the simulation has succeeded.

18 Claims, 10 Drawing Sheets

(56) References Cited

U.S. PATENT DOCUMENTS

| | | | |
|---|---|---|---|
| 2018/0350144 A1* | 12/2018 | Rathod | H04W 4/029 |
| 2019/0065027 A1* | 2/2019 | Hauenstein | G06F 3/04815 |
| 2019/0164055 A1* | 5/2019 | Ljung Larhed | G06N 3/084 |
| 2019/0206131 A1* | 7/2019 | Kamal | G06T 7/70 |
| 2019/0244008 A1* | 8/2019 | Rivera | G06K 9/00201 |

* cited by examiner

METHODS AND SYSTEMS FOR PROVIDING A TUTORIAL FOR GRAPHIC MANIPULATION OF OBJECTS INCLUDING REAL-TIME SCANNING IN AN AUGMENTED REALITY

TECHNICAL FIELD

The present disclosure generally relates to methods and systems for providing an object recognition tutoring application and, more particularly, for providing a tutoring application for training a user on how to capture real-world objects using a simulation environment for simulating capturing augmented reality elements displayed on a mobile device.

BACKGROUND

Identification of objects such as vehicles using computer-implemented image analysis is used in various applications. For example, license plate image recognition systems are frequently used in automated tollgates that identify moving vehicles to facilitate collecting tolls. In addition, systems that combine license plate recognition and detection of vehicle features, such as car color or make, are used to improve identification accuracy when the license plate cannot be adequately identified. For example, highly accurate vehicle identification based only on vehicle features is possible with techniques based on machine learning algorithms such as convolutional neural networks. Such algorithms capture features from images of known vehicles and then identify an unknown vehicle in an image by correlating image features. Although such machine learning techniques may be computationally intensive, they can improve identification accuracy and facilitate the automation of a vehicle image identification system.

Traditionally, image recognition of vehicles has focused on non-portable applications, such as the above-noted toll collection, monitoring the entrance of a parking lot, or supervising highway entrances. However, identification of vehicles using mobile or handheld devices is highly desirable for portable applications. For example, when a person sees a vehicle in the street and wants information about it, the person would normally need to approach the vehicle to determine details such as make or model. Alternatively, the person may need to browse multiple images and websites to try to find vehicle characteristics. Portable identification of vehicles using image analysis may facilitate the identification of vehicles without the burden of approaching the vehicle or perform later searches.

SUMMARY

Consistent with a disclosed embodiment, a device including a storage medium storing instructions, and at least one processor configured to execute the stored instructions to perform operations, is provided. The operations include displaying on a display screen an interactive scene containing an augmented reality element, receiving input to change display of the interactive scene, and receiving a request to simulate the capturing of image data representing the interactive scene. The operations further include determining a position of the augmented reality element relative to a region defined on the display screen, simulating the capturing of the image data representing the interactive scene, and providing, based on the determined position, an indication of whether the simulation has succeeded.

Consistent with another disclosed embodiment, a training method for using a device for object recognition is provided. The method includes displaying on a display screen an interactive scene containing an augmented reality element, manipulating the device resulting in changes of how the interactive scene is displayed, receiving a request to simulate the capturing of image data representing the interactive scene, and determining a position of the augmented reality element relative to a region defined on the display screen. The method further includes simulating the capturing of the image data representing the interactive scene, and providing, based on the determined position, an indication of whether the simulation has succeeded.

Consistent with another disclosed embodiment, a device including a storage medium storing instructions, and at least one processor configured to execute the stored instructions to perform operations is provided. The operations include displaying on a display screen an interactive scene containing an augmented reality element, manipulating the device resulting in changes of how the interactive scene is displayed, receiving a request to simulate the capturing of image data representing the interactive scene, and determining a position of the augmented reality element relative to a region defined on the display screen. The operations further include providing, based on the determined position, an indication of whether the simulation will be successful, and simulating the capturing of the image data representing the interactive scene.

The foregoing general description and the following detailed description are exemplary and explanatory only and are not restrictive of the claims.

BRIEF DESCRIPTION OF THE DRAWINGS

The accompanying drawings are not necessarily to scale or exhaustive. Instead, the emphasis is generally placed upon illustrating the principles of the embodiments described herein. These drawings, which are incorporated in and constitute a part of this specification, illustrate several embodiments consistent with the disclosure and, together with the detailed description, serve to explain the principles of the disclosure. In the drawings.

DETAILED DESCRIPTION

Figure 1A:
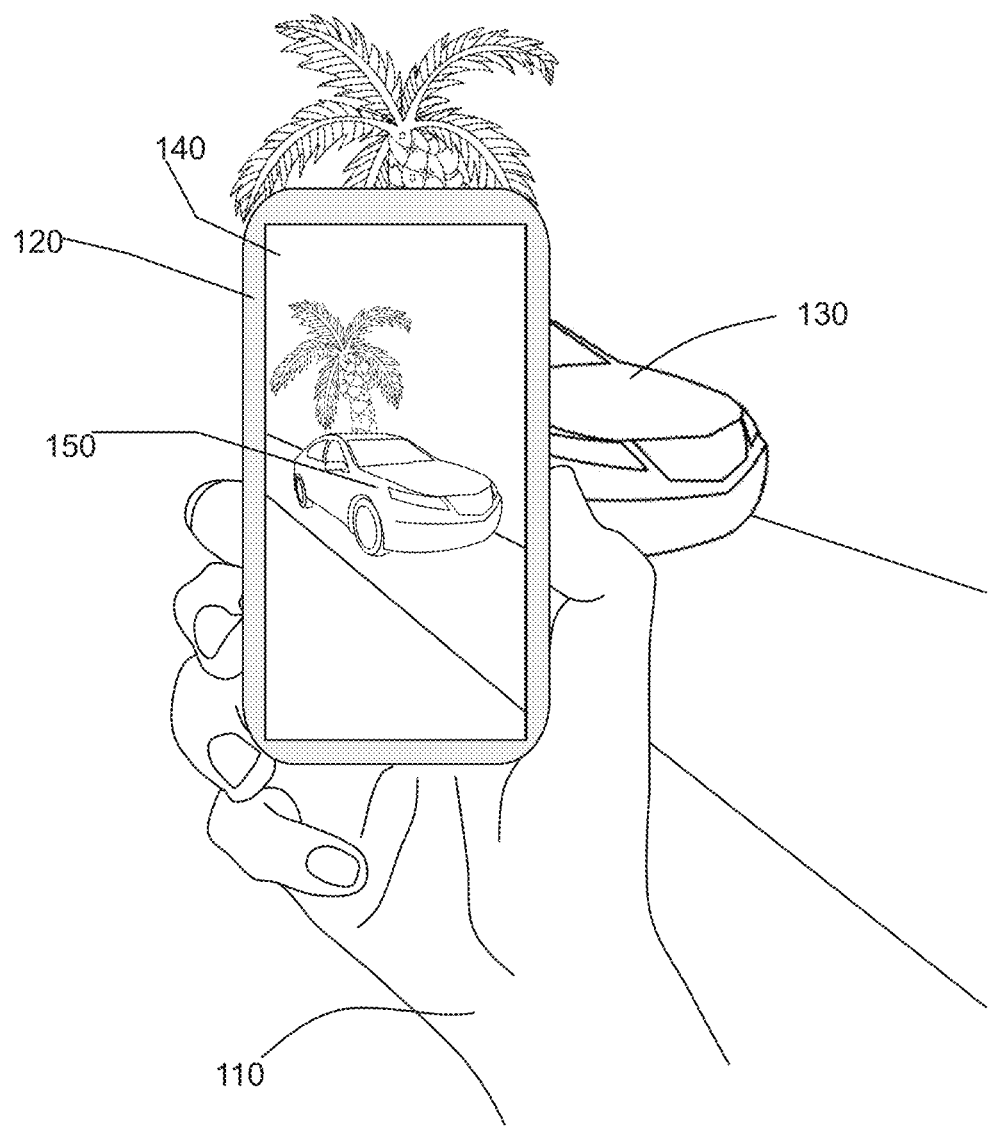
FIGS. 1A-1C show an illustrative device for capturing an object for object recognition consistent with disclosed embodiments.

Reference will now be made in detail to exemplary embodiments, discussed with regard to the accompanying drawings. In some instances, the same reference numbers will be used throughout the drawings and the following description to refer to the same or like parts. Unless otherwise defined, technical and/or scientific terms have the meaning commonly understood by one of ordinary skill in the art. The disclosed embodiments are described in sufficient detail to enable those skilled in the art to practice the disclosed embodiments. It is to be understood that other embodiments may be utilized and that changes may be made without departing from the scope of the disclosed embodiments. Thus, the materials, methods, and examples are illustrative only and are not intended to be necessarily limiting.

Embodiments of the present disclosure relate to portable identification of objects, such as vehicles, using an object recognition application that may be installed on a handheld device. Identification of vehicles using handheld devices is desirable, as handheld devices offer capabilities not available for other devices. For example, handheld devices may enable augmented reality applications that improve the user experience. After a vehicle is automatically identified, it may be possible to generate and superimpose a computer-generated image on a screen of a client handheld device to seamlessly provide information about the vehicle. Also, portable detection of vehicles using handheld devices may enable advertising opportunities. For example, a customer may use the handheld device to identify vehicles that the user is interested in purchasing. After identifying the vehicle, the user may receive information about the vehicle and location information about car dealers selling the vehicle. Thus, portable image recognition of vehicles enables new desirable applications.

However, identification of vehicles using object recognition in handheld devices has multiple technical challenges. First, machine-learning methods that provide enough precision for image analysis are computer intensive and may be difficult to perform in a handheld device. Furthermore, users need to gain experience before using handheld devices to identify vehicles. For example, one of the technical challenges of object recognition is maintaining a high recognition accuracy, which closely depends on the quality of a captured image. To capture a high-quality image amenable to high recognition accuracy, a user may need to capture the image of a vehicle at an appropriate distance and within a specified frame (e.g., the image of the captured vehicle is positioned within the specified frame). Thus, users may greatly benefit from a guided tutorial demonstrating suitable image capturing techniques.

The disclosed embodiments are related to systems and methods for training a user how to use an object recognition application via a tutoring application that may be installed on a client device (e.g., handheld device). In various embodiments, the tutoring application may be a software module that simulates aspects of the object recognition application. As used herein, the term "object" may refer to any suitable real-world object that can be captured using a camera from a sufficiently close distance. In an exemplary embodiment, the object may be a vehicle such as a car, a boat, a motorcycle, a bicycle, etc. The object may be captured from a distance that may range from one millimeter to several miles, with typical distances that may range from one to a few hundred feet. In some embodiments, the tutoring application may be configured to train a user to accurately capture an object from a close distance (e.g., distance of 20 feet) and in some embodiments, the tutoring application may be configured to train a user to accurately capture an object from a set of distances in the range of one to a few hundred feet.

Turning to the figures, FIG. 1A shows an illustrative client device 120 for capturing an object 130 for object recognition. In an example embodiment, client device 120 may be held by a user 110, who can point device 120 at an object 130 (e.g., a vehicle) for recognition. Client device 120 shown in FIG. 1 may be a mobile device (e.g. a smartphone, a tablet and the like) having a screen 140 that depicts object 130 as an object image 150 of captured object 130. As defined herein unless otherwise noted the term "capture" refers to a process of obtaining an image of a real-world object (e.g. object 130) and saving the image onto a memory device (e.g., flash-drive). Client device 120 may be a mobile device (e.g., tablet, smartphone, etc.), a gaming device, a wearable computing device such as virtual reality headset, or another type of computing device (e.g., laptop). Client device 120 may include more than one computing/capturing device.

In various embodiments, client device 120 may have a tutoring application installed therein for training a user to use the object recognition application for capturing objects. While the term "capture" may refer to capturing an object using a camera for capturing visible light, it should be understood that this term is not limited to visible light. For example, during the capturing process, infrared, ultraviolet, microwave and other radiation may be recorded. Additionally, or alternatively, other object-related information may be captured as well. For example, audio information related to the object may be captured. In an example embodiment, information related to ultrasound may be recorded.

Figure 1B:
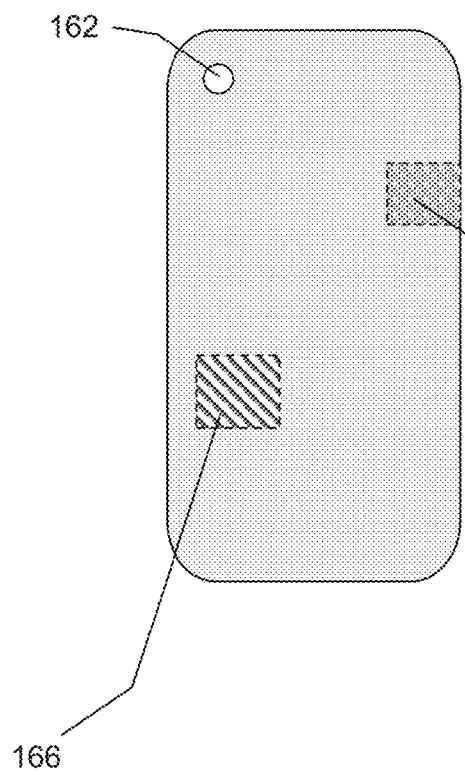

FIG. 1B shows rear view of client device 120, depicting a capturing device 162 (e.g., camera). In some embodiments capturing device 162 may be a wearable camera that may interact/connect wirelessly or wiredly (herein the term "wiredly" is used to indicate that connection may include a physical wire) connecting device 162 with device 120. In some embodiments, more than one capturing device 162 may be used.

In various embodiments, capturing device 162 may comprise a visible-light camera, an infrared camera, an audio recording device, an ultrasound recording device, etc. While in many instances capturing device 162 may be a "passive device," that is a device that acquires the signals from an object without actively generating signals, in some embodiments, capturing device 162 may be an active device. For example, an active capturing device 162 may be configured to emit electromagnetic radiation (e.g., light via photo-flash), ultrasonic signals, or other type of radiation and/or sound. For example, capturing device 162 may include an infrared laser source or a visible light laser source. Such sources may facilitate measuring distance between capturing device 162 and the object and assist in adjusting parameters of capturing device 162 based on the measured distance to the object.

In various embodiments, client device 120 may include a computer-readable storage medium 164, as shown in FIG. 1B, for storing instructions. Computer-readable storage medium 164 may be, for example, but is not limited to, an electronic storage device, a magnetic storage device, an optical storage device, an electromagnetic storage device, or any suitable combination of the foregoing. A non-exhaustive list of more specific examples of the computer-readable storage medium may include a hard disk, a random access memory (RAM), a read-only memory (ROM), an erasable programmable read-only memory (EPROM or Flash memory), a static random access memory (SRAM), a portable compact disc read-only memory (CDROM), a digital versatile disk (DVD), a subscriber identity module (SIM card) a memory stick, or the like.

Client device 120 may include a processor 166 configured to execute the stored software instructions. The processor may be a central processing unit (CPU) or a special-purpose computing device, such as a graphical processing unit (GPU), a field-programmable gate array (FPGA) or application-specific integrated circuits. In various embodiments, the processor may be part of a client device.

Figure 1C:
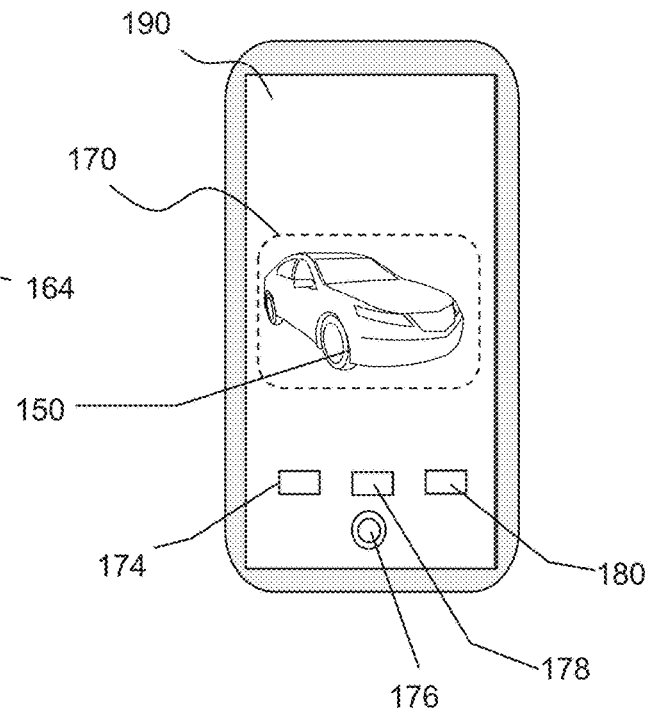

In various embodiments, client device 120 may be configured to train user 110 to use object recognition software via a tutoring application that includes an interface 190 (FIG. 1C) for displaying object image 150. Interface 190 may include one or more graphical user interface (GUI) components 174-180, as shown in FIG. 1C for manipulating client device 120 to change the manner in which object image 150 corresponding to real-world object 130 is displayed. For example, a GUI component 174 may be used to zoom towards object image 150, a component 176 may be used to capture image corresponding to object 130, an element 178 may be used to change brightness of object image 150, and an element 180 may be used to indicate that a video related to object 130 needs to be captured. It should be noted that other GUI components may be used to manipulate various aspects of client device 120 that are not limited to examples discussed above. GUI components 174-180 may include toolbars, buttons, sliders, and/or any other selectable graphics features. In various embodiments, GUI components may be combined with a natural user interface characterized by its ability to receive user input by natural input methods, such as gestures. In an example embodiment, interface 190 may prompt user 110 to start a tutoring application, for example, pressing a button, using a gesture over a portion of the screen, using audio and/or video input, or the like.

In various embodiments, interface 190 may be configured to assist user 110 in capturing an image associated with object 130 by presenting user 110 with a GUI component 170, as shown in FIG. 1C, for positioning the image of object 130. In various embodiments GUI component 170 may be any region detectable on screen 140 of client device 120. For example, component 170 may be a semitransparent region, such as a rectangle, a boundary of a transparent region detectable on screen 140 of client device 120, a set of disconnected boundary elements (e.g. brackets represent at least two edges of a boundary), a set of points (e.g., corners of a transparent rectangle), a circular boundary, a circular semitransparent region, and/or the like.

Figure 2:
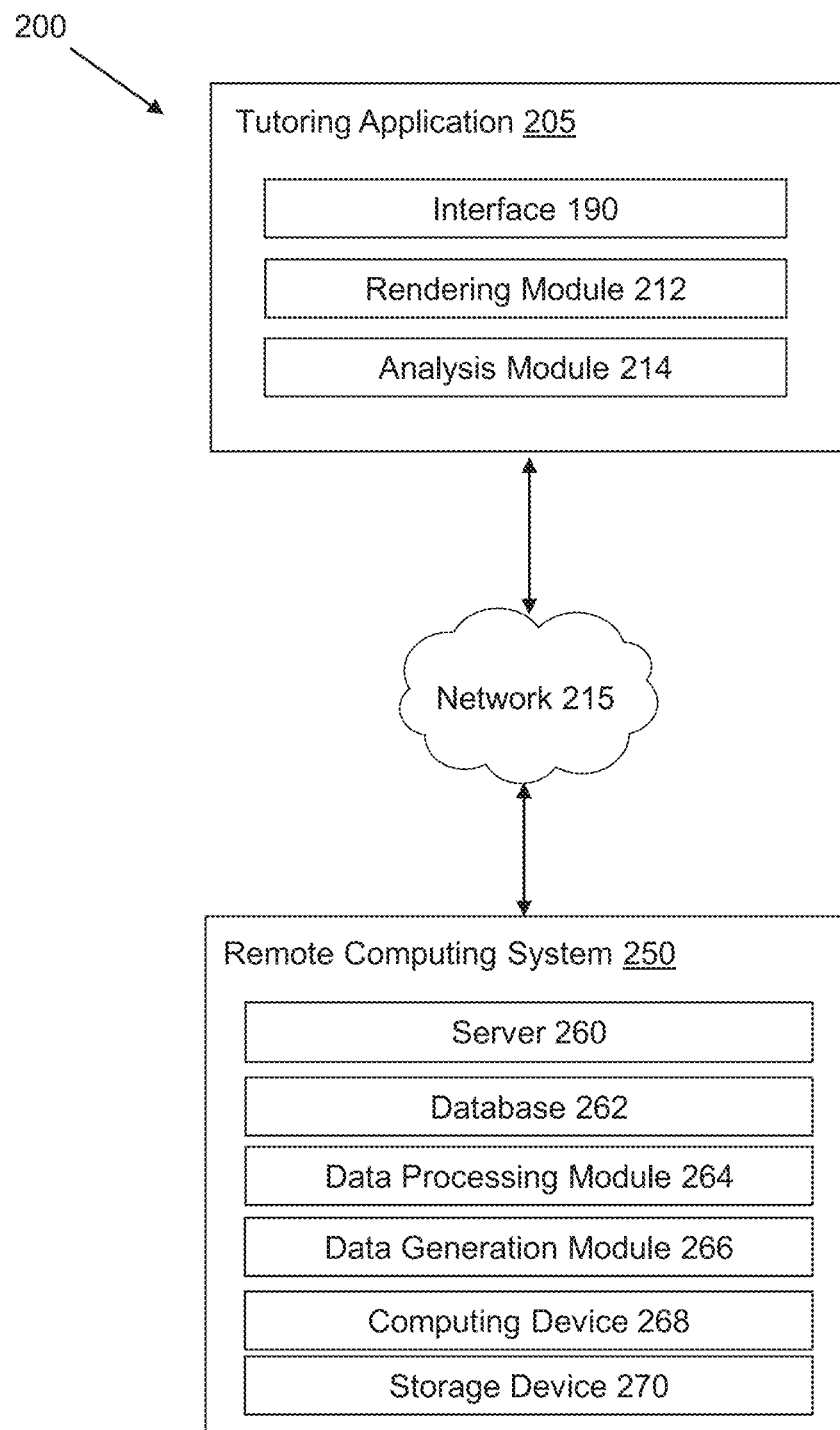
FIG. 2 is a diagram of an illustrative system for training a user to use an object recognition software consistent with disclosed embodiments.

FIG. 2 is a block diagram of an exemplary system 200 for training user 110 to use object recognition software, consistent with disclosed embodiments. System 200 includes a tutoring application 205 and a remote computing system 250. In an example embodiment, tutoring application 205 may be a software application installed on client device 120. Tutoring application 205 may have interface 190, a rendering module 212, and an analysis module 214 that may constitute separate software applications installed on client device 120.

Remote computing system 250 may include a server 260, a database 262, a data processing module 264, and a data generation module 266. In various embodiments, server 260, database 262, data processing module 264 and data generation module 266 may be software applications. In addition to the software applications, system 250 may include computing devices 268 and storage devices 270. Various aspects of the components of system 250 are discussed below.

In some embodiments, as shown in FIG. 2, application 205 and system 250 may be connected to a network 215. Components of application 205 and system 250 may exchange information via network 215. For example, system 250 may provide upgrades to application 205 via network 215 when application 205 is not in use but is connected to the network. Additionally, or alternatively, application 205 may communicate with system 250 to transmit information to system 250 or receive information from system 250. In some embodiments, application 205 and system 250 may communicate frequently, and in some embodiments, components of application 205 may operate independently from remote computing system 250 for an extended period of time without connecting to network 215.

In various embodiments, network 215 may be any type of network that provides communications, exchanges information, and/or facilitates the exchange of information between tutoring application 205 and remote computing system 250. For example, the network 215 may be the Internet, a Local Area Network, a cellular network, a public switched telephone network ("PSTN"), or other suitable connection(s) that enables tutoring application 205 to send information to and receive information from remote computing system 250. A network may support a variety of electronic messaging formats and may further support a variety of services for tutoring application 205.

Once tutoring application 205 starts, screen 140 may provide user 110 with a realistic representation of the user's environment (e.g. a real-world view as captured by an image capturing device 162) as well as computer-generated images, also referred to herein as augmented reality (AR) or AR elements superimposed on the real-world view. Additionally, or alternatively, a realistic representation of the user's environment may be displayed for user 110 via specially designed goggles. For example, the goggles may be specially designed translucent goggles enabling user 110 to view AR elements superimposed on the real-world view. A process of user 110 interacting with tutoring application 205 may be referred to as a tutoring session or capturing session. A process of user 110 using an object recognition application for capturing and recognizing real-world object may be referred to as a real-world capturing session.

In various embodiments, augmented reality may refer to an interactive experience of a real-world environment where the images or video data corresponding to objects that reside in the real-world are "augmented" by computer-generated perceptual elements that may include visual and auditory information. The AR elements overlaid over an image displaying real-world environment may be seamlessly interwoven with the visual representation of the physical world such that it is perceived as an immersive aspect of the real environment. In various embodiments the AR elements may be implemented using various available AR libraries such as ARkit, Wikitude SDK, ARCore, Vuforia and the like.

In various embodiments, interface 190 of tutoring application 205 may be configured to display an interactive scene containing an AR element. As used herein, unless otherwise noted, the term "interactive scene" refers to a scene containing a realistic representation of the users' environment, a representation which can respond to inputs of the user. In various embodiments, user 110 may manipulate device 120 resulting in changes of how the interactive scene is displayed. For example, user 110 may manipulate device 120 via user gestures resulting in zooming in and out of the interactive scene. Other examples of user 110 manipulating device 120 may include laterally moving client device 120 resulting in a lateral shift of a viewpoint for the interactive scene, rotating client device 120 resulting in panning of the viewpoint of the interactive scene, or moving client device 120 toward or away from an AR element representing object 130, resulting in altering the rendering of the AR element (e.g., zooming in or out of the AR element). Rotating client device 120 may involve rotating device 120 over a user selected angle about an axis that passes through a point of client device 120.

Figure 3:
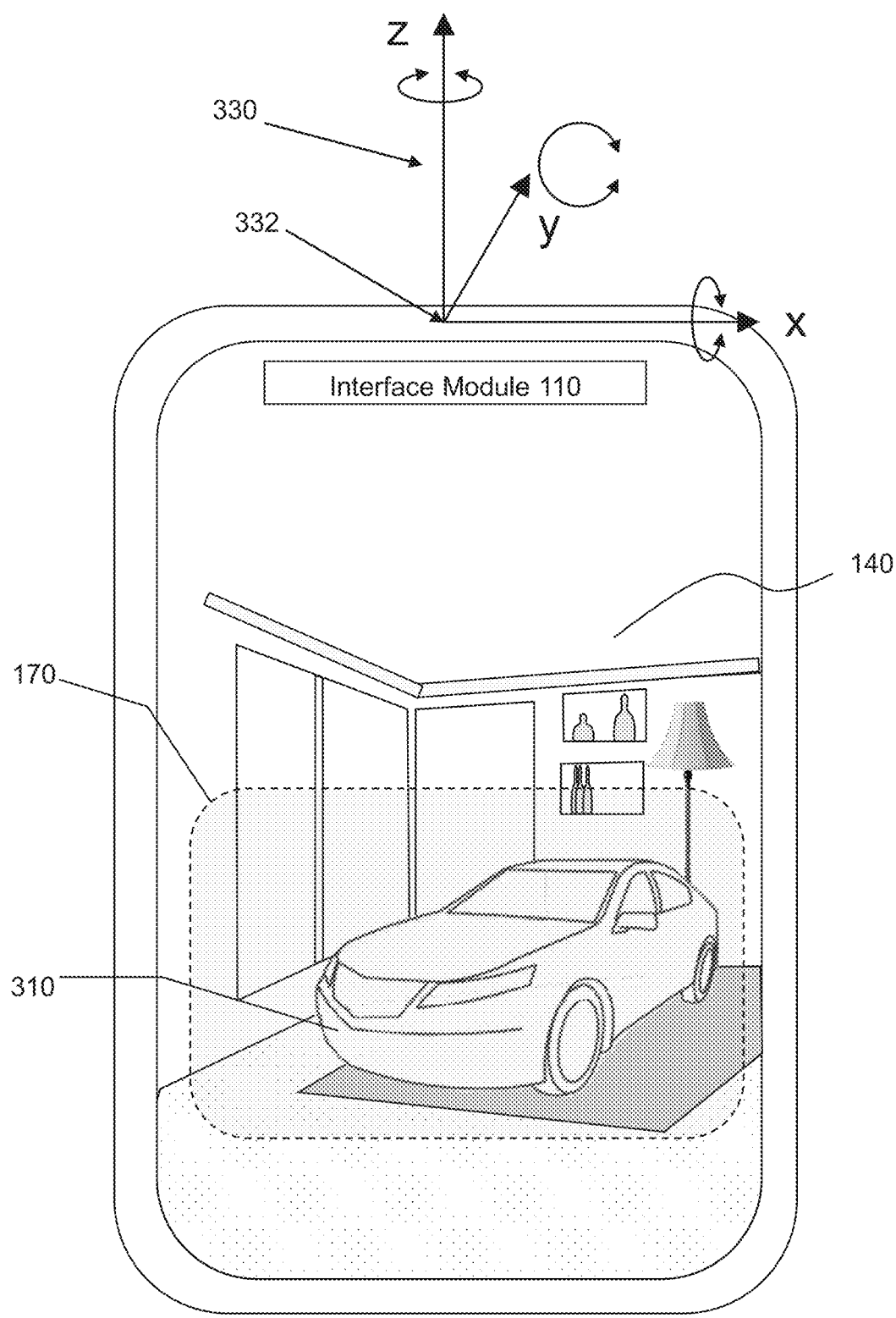
FIG. 3 is an illustrative interface of a tutoring application, consistent with disclosed embodiments.

An example of axes that pass through a point of client device 120 is shown in FIG. 3. FIG. 3 shows a coordinate system 330 with axes x, y, and z that can be used for rotating device 120. In some embodiment, an origin 332 of coordinate system 330 may be located at a top location of client device 120, and in some embodiments, it may be at a center of mass of client device 120. The location of origin 332 described above is only illustrative, and any other location within or in proximity of client device 120 may be used.

In some embodiments, a realistic representation of user 110 environment may be obtained by capturing still or video images using device 162 of client device 120. Additionally, or alternatively, user 110 environment may be modeled either based on the captured still image/video data (herein referred to as image data) from device 162, by artificially constructing a possible model of user 110 environment (or a model of a portion of user 110 environment). In some embodiments, models of the user 110 environment may be pre-compiled. For example, user 110 may select a type of environment in which user 110 resides, (e.g., cityscape, mountain region, Times Square, walking along the Golden Bridge in St. Francisco, etc.) while practicing the capture of object 130 for use in generating a representative AR element. Once selected, the interactive scene related to the pre-compiled model may be depicted on a screen of client device 120 or may be shown to the user via interactive goggles. In various embodiments, pre-compiled models may display images corresponding to real-world objects and may support various ways for user 110 to manipulate device 120 via user gestures resulting in altering display of the real-world objects of the pre-compiled models, or moving or rotating a viewpoint for the interactive scene. In addition to user 110 manipulating the interactive scene via movement of device 120 described above, user 110 may manipulate the interactive scene via gestures.

Tutoring application 205 may display a variety of AR elements that are combined with a view of the real-world environment to create a virtual environment. Such elements may include natural elements (e.g., trees, tables, etc.) and, in various embodiments, AR elements may include three-dimensional models of real-world objects that require recognition. In various embodiments, rendering module 212 may be used to control all aspects of rendering the AR elements. As used herein, unless otherwise noted, rendering an AR element representing a real-world object involves computing various parameters related to the element (e.g., color of the element, shadows cast by the element, shadows over the element, etc.). In various embodiments, rendering the AR element also includes displaying the element superimposed on the displayed objects of the real-world environment.

In an example embodiment, rendering module 212 may render a three-dimensional model of a vehicle as an AR element for depiction on screen 140. For example, an illustrative three-dimensional model of a vehicle may be placed in an environment of user 110, such as a room or office of user 110 at a location within the room that can fit the size of the AR model. For example, rendering module 212 may evaluate the space within the environment by using spatial cues that can be used to estimate available space. For instance, special cues may be objects such as chairs, tables, books, standing lights, distance between a floor of a room and a ceiling and/or the like. In some embodiments, rendering module 212 may be configured to recognize objects that can be used as a length scale for estimating available space in the room for the AR element (e.g., a AR vehicle element 310 shown in FIG. 3). For instance, rendering module 212 may detect the position of the ceiling and the floor of the room and estimate the distance between the floor and the ceiling to be eight feet. The distance between the floor and the ceiling may then be used as a measuring scale to estimate the space within the user 110 environment. Alternatively, rendering module 212 may place an AR element within the interactive scene corresponding to the environment of user 110 disregarding the place and available space within the interactive scene. In some embodiments, rendering module 212 may inquire from the user about an appropriate position of the AR element before placing it within the interactive scene.

FIG. 3 shows an example rendering of a three-dimensional AR element 310 representing vehicle 130 within screen 140 of user 110. While screen 140 may realistically display environmental objects (e.g., a carpet, a set of embedded shelves, windows and a standing light shown in FIG. 3) in the interactive scene, AR element 310 may be generated by rendering module 212 and rendered in the interactive scene.

AR elements may be rendered using raytracing algorithms that may be based on placement of virtual light sources and viewpoint of client device 120. In some embodiments, AR element rendering may use the device's internal sensors to track rotation in three degrees of freedom. Such tracking may be a useful approach for rendering AR elements representing far-off real-world objects at locations outside the device's immediate vicinity. Additionally, or alternatively, AR element rendering may use "world tracking" to track device 120 camera viewing orientation and any changes in device 120 physical location. In such configuration, AR elements may change position and orientation as client device 120 is moved laterally relative to the AR element.

In various embodiments, lighting and shadowing may be applied to AR elements when these elements are rendered in the interactive scene. In some embodiments, as user 110 moves and reorients within a real-world environment, the information about user 110 environment is tracked and collected, and the AR element rendering accuracy may increase. In some cases, rendering of the AR element may change as user 110 moves and reorients within the real-world environment. For example, the AR element may appear closer to user 110 as user 110 moves client device 120 forward. The AR element may appear to move laterally on screen 140 of client device 120 as user moves client device 120 in a lateral direction (i.e., a direction tangential to the normal direction for screen 140). In some embodiments, tutoring application 205 may prompt user 110 via interface 190 to alter rendering of the AR element by moving around the AR element, by zooming towards the AR element or by changing orientation relative to the AR element. In various embodiments, tutoring application 205 may prompt user 110 to alter rendering of the AR element as a part of a tutoring process. In various embodiments, alteration of the rendering of the AR element may be referred to as real-world-related manipulations. As used herein, the term "real-world-related" refers to manipulations associated with user 110 moving through a physical space of real-world environment (e.g., moving around a room where user 110 is located or rotating client device 120.

In some embodiments, prior to starting the tutoring session, tutoring application 205 may ask a user to position/ orient client device 120 to point in various directions and may select a direction that is the most advantageous for capturing real-world objects for the interactive scene used to display the AR element. For example, tutoring application 205 may suggest to user 110 to point client device 120 towards a section of a room that includes a large open area. In an example embodiment, application 205 may instruct user 110 not to point at aspects of a real-world environment that, when displayed in the interactive scene, may not be able to accommodate the rendered AR element. For example, application 205 may instruct user 110 not to point at a flat region of a wall, a ceiling, or a window sill. In various embodiments, as user 110 positions/orients client device 120, tutoring application 205 may be configured to scan the real-world space around user 110 and detect various aspects of a real-world environment (e.g., walls, floor, ceiling, windows, tables, etc.) that may be used by tutoring application 205 to suggest to user 110 the best position/orientation for client device 120, as well as a distance and/or angle from a section of a room that includes a large open area, and client device 120. In some embodiments, tutoring application 205 may capture image data of the real-world environment and communicate it to data processing module 264 of remote computing system 250 for processing the real-world-related data.

In some embodiments, tutoring application 205 may be configured not only to display the AR element but also to augment reality by altering the display of the real-world environment. For example, application 205 may be configured to change lighting for the interactive scene corresponding to the real-world environment (e.g., display the interactive scene at dusk or at night time), to display fog or rain overlaying the interactive scene or alter perception (i.e., placement, color, sharpness) of shadows for objects within the interactive scene. In some embodiments, application 205 may include artificial lighting sources that may be used to illuminate the AR elements presented within the interactive scene.

In some embodiments, user 110 may control the orientation and position of the AR element within the interactive scene corresponding to the real-world environment via interface 190. For example, during a tutoring session, user 110 may pan the displayed AR element laterally within the screen of client device 120, rotate the AR element around an axis of a three-dimensional system (the axes for the three-dimensional system may be displayed during the tutoring session), position the origin of the axes at an appropriate location within the screen, and/or increase/decrease the size of the AR element as compared to real-world objects of the interactive scene. In some embodiments, tutoring application 205 may be configured to display the AR element moving and/or rotating as it is rendered by rendering module 212 of tutoring application 205 during a tutoring session.

Interface 190 of tutoring application 205 may generate an AR element corresponding to a real-world object, such as AR vehicle element 310 shown in FIG. 3, by simulating a process of capturing an interactive scene containing AR vehicle element 310 using a virtual capturing device (e.g., virtual camera). As defined herein, unless otherwise noted, the process of simulating the capturing of the interactive scene containing AR vehicle element 310 is referred here as "simulated capture" or "simulate-capture" of the interactive scene. Simulated capture may provide a similar (or virtually identical) experience for user 110 as a process of real-life capture of the real-world objects. Nevertheless, the term "simulated capture" is specifically used to differentiate the simulated capturing process from the real-life capturing process.

In various embodiments, interface 190 may allow user 110 to adjust one or more parameters of the virtual capturing device. For example, such parameters may include a focal length of the virtual capturing device, aperture size, shutter speed, light sensitivity, white balance, zoom, and other suitable parameters that may be related to the quality of the image obtained by the virtual capturing device when simulate-capturing the AR elements. In various embodiments, interface 190 may prompt user 110 to adjust/select one or more parameters of the virtual capturing device as a part of a tutoring process. Training user 110 to adjust such parameters may help user 110 to get acquainted with parameter adjustments of the capturing device of the object recognition application for capturing and subsequent recognition of real-world objects.

Tutoring application 205 may include GUI components configured to teach user 110 how to adjust the parameters of capturing device 162. For example, tutoring application 205 may present user 110 with a simulation process of adjusting the parameters using a virtual assistant (e.g., assistant represented by an AR element capable of interacting with various GUI components of tutoring application 205). Such an assistant may be, for example, a mouse pointer, an avatar configured to point at various GUI components, and/or the like. In some embodiments, the virtual assistant may interact with the GUI components using any of screen-related manipulations that user 110 can use when manipulating device 120. As used herein, the term "screen-related" refers to manipulations not associated with user 110 actually moving through a physical space of real-world environment (e.g., moving around a room where user 110 is residing) or rotating client device 120. Screen-related manipulations may include, for example, user 110 executing on-screen gestures or user 110 interacting with the GUI components. Such actions may lead to various manipulations with the AR element that may include zooming towards the AR element, moving the AR element relative to the interactive scene corresponding to the real-world environment and/or the like. In various embodiments, screen-related manipulations include all the manipulations that can be executed via screen 140 of client device 120.

Tutoring application 205 may receive a request (or command) to simulate-capture the interactive scene containing the AR element. For example, user 110 may issue a command to tutoring application 205 via interactive module 210 using any suitable means such as tapping on a GUI component (e.g., component 176, as shown in FIG. 1C), using a gesture, and/or the like. Upon receiving the command from user 110, tutoring application 205 may save the image data of the interactive scene and submit the saved data to analysis module 214. In an example embodiment, the saved data may be still image data, while in another embodiment, the saved data may be video data. For example, the video data of the AR element may be saved while manipulating the interactive scene using one of the available ways to manipulate the interactive scene (e.g., using user gestures resulting in zooming towards the AR element, rotating a viewpoint of the interactive scene, or combination of thereof).

Figure 4A:
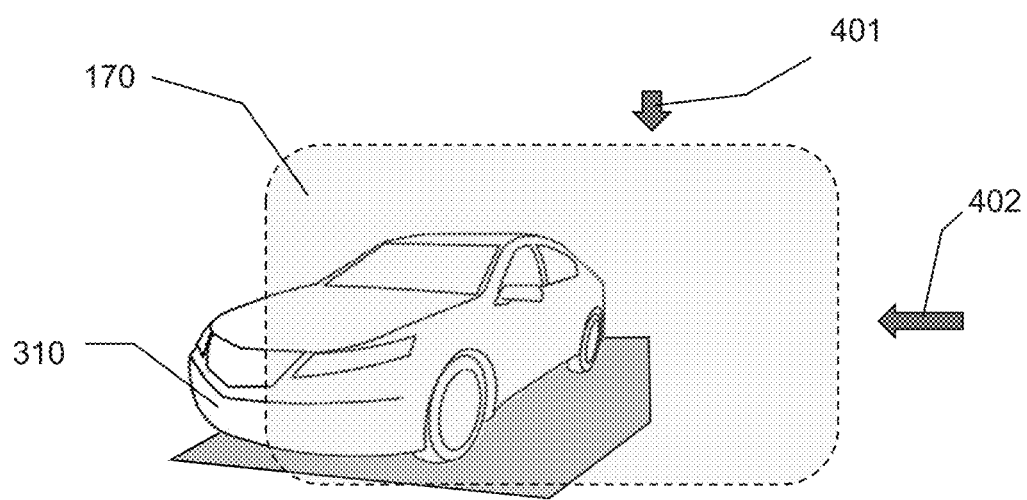
FIGS. 4A-4E are illustrative views of augmented reality elements rendered by an interface of a tutoring application, consistent with disclosed embodiments.

FIGS. 4A-4E are illustrative views of AR elements rendered by rendering module 212 of tutoring application 205. In particular, FIG. 4A shows GUI component 170 that only partially overlays AR vehicle element 310 representing the real-world vehicle. Interface 190 may show a set of arrows (e.g., arrows 401 and 402) indicating how to move component 170 for best simulate-capturing AR vehicle element 310. In some embodiments, interface 190 may display a message to instruct user 110 of client device 120 to physically adjust capturing device 162 (e.g., camera of client device 120) to place the screen image of AR vehicle element 310 in a better location on screen 140 so that AR vehicle element 310 may be successfully simulate-captured.

Figure 4B:
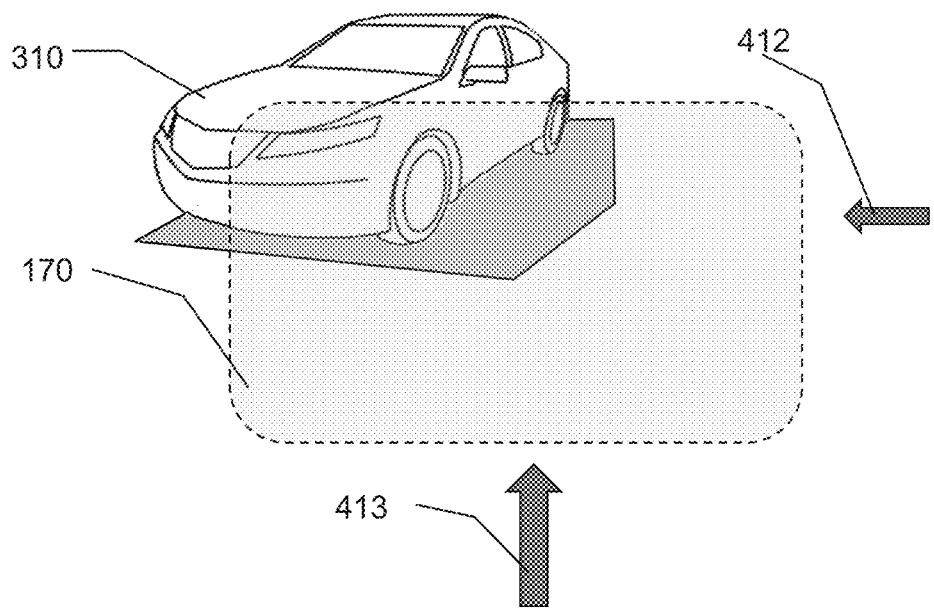
Figure 4C:
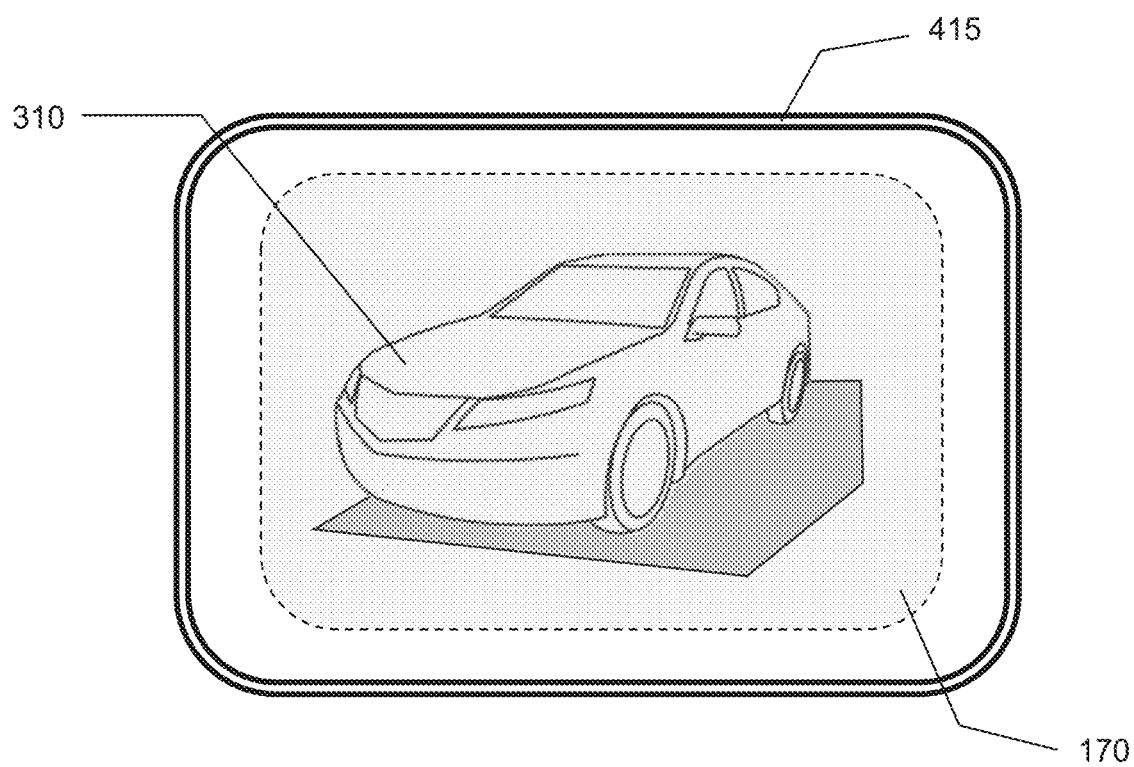

FIG. 4B shows another example embodiment in which GUI component 170 is slightly below and to the right of the displayed image of AR vehicle element 310. Arrows 412 and 413 indicate how component 170 may be moved to a better position by orienting capturing device 162 for simulate-capturing AR vehicle element 310. In some embodiments, the size of arrows 412 and 413 may indicate the amount of motion that is required by user 110 to adjust the position and orientation of capturing device 162 to successfully simulate-capture the interactive scene including AR vehicle element 310. FIG. 4C shows that interface 190 may present user 110 with an indication (e.g., a frame element 415) that image data related to AR vehicle element 310 is ready to be saved.

Figure 4D:
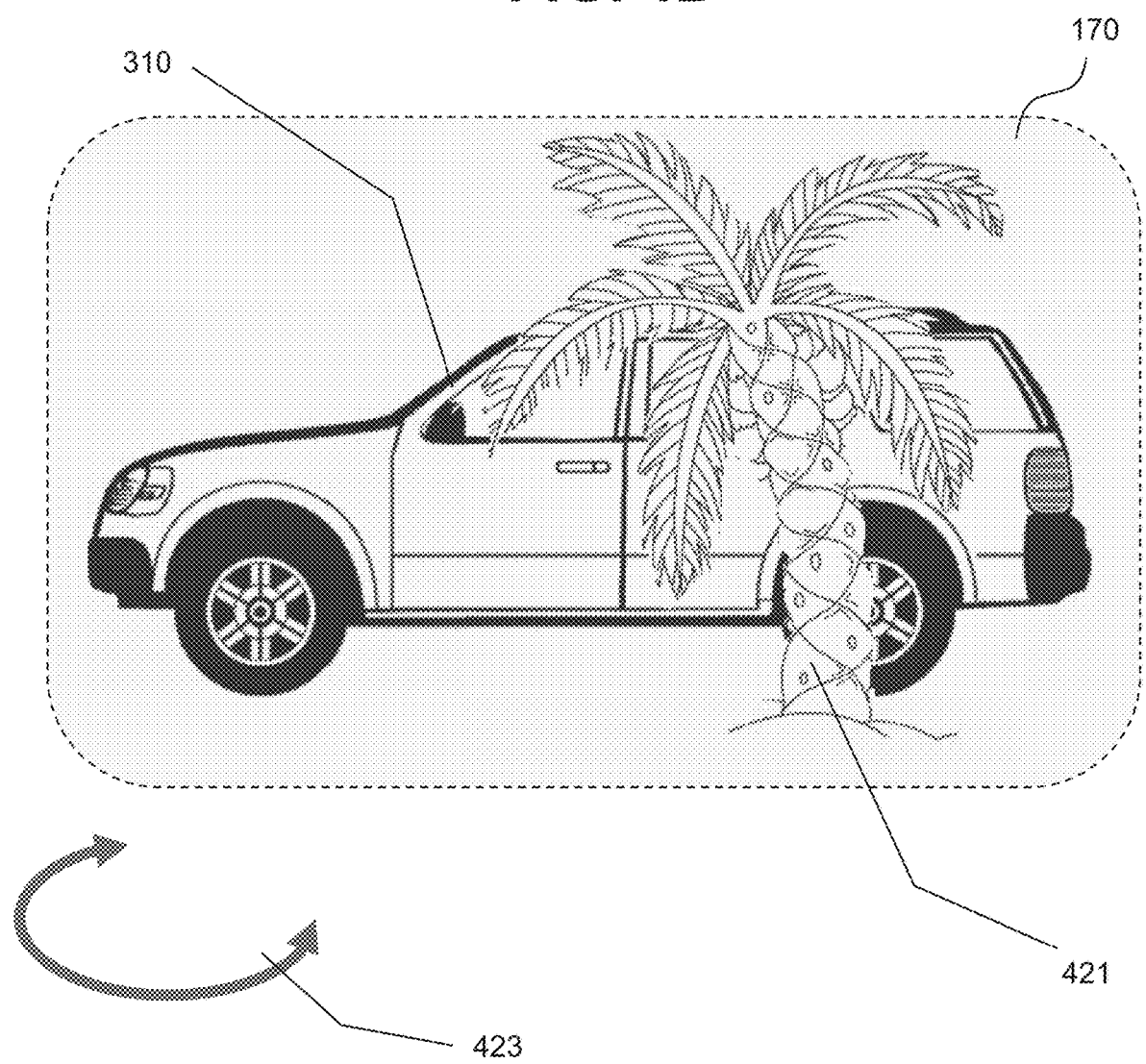

FIG. 4D shows an example embodiment in which a first AR element 421, representing a palm tree, obscures part of a second AR element, such as AR vehicle element 310. Interface 190 of tutoring application 205 may present such configuration to user 110 in order to show user 110 the appropriate way to simulate-capture image data of the interactive scene containing a partially obscured AR element, e.g., AR vehicle element 310. In an example embodiment, application 205 via interface 190 may indicate to user 110 using GUI component 423 that a new physical viewpoint needs to be selected in order to successfully simulate-capture AR vehicle element 310. For example, component 423 may indicate that user 110 needs to choose a different position in the real world by, for example, simulating walking in front of AR vehicle element 310, simulating walking behind AR vehicle element 310, zooming towards a portion of AR vehicle element 310, rotating capturing device 162, and/or the like.

While it may be feasible for user 110 to walk around the room and simulate an action of repositioning capturing device 162 to simulate-capture AR vehicle element 310 from a different viewing position, additionally, or alternatively, interface 190 may have a functionality of virtually rotating the AR vehicle element 310 on screen 140 of client device 120 without requiring the client device 120 be moved through a physical space. While such functionality is not available for situations when real vehicles are captured during a real-life vehicle capturing process, such functionality may be available for tutoring application 205.

Figure 4E:
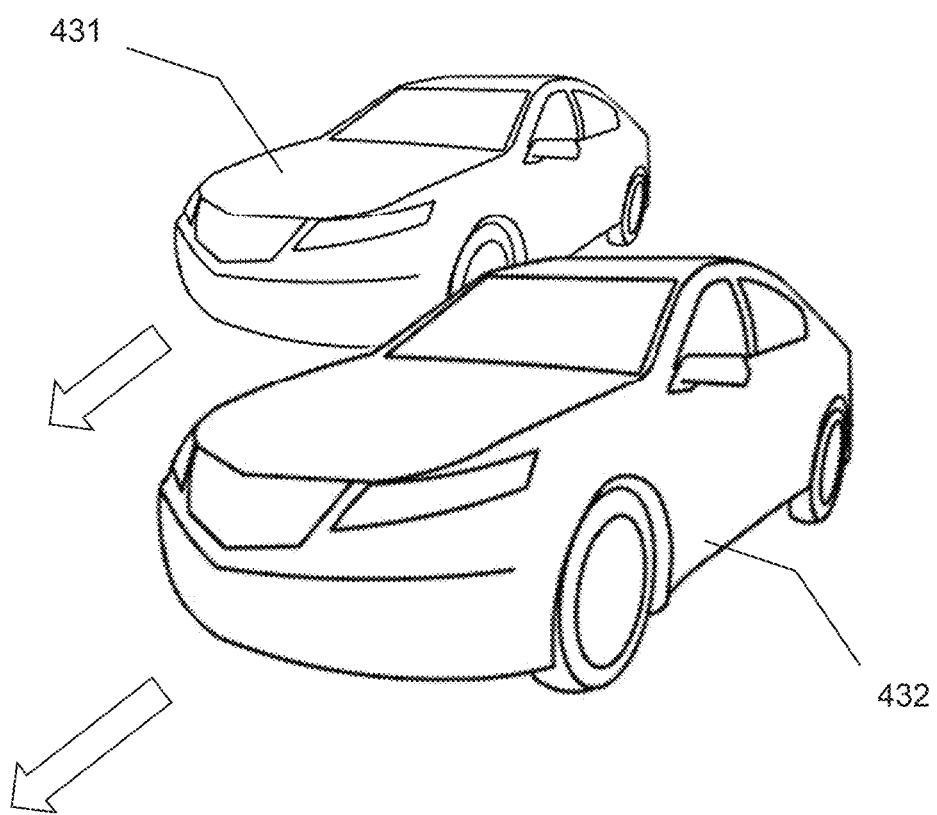

FIG. 4E shows that tutoring application 205 may train user 110 to capture real-world objects such as vehicles in motion by simulating the capturing process using AR elements. For example, user 110 may be trained to simulate-capture an AR vehicle element 431 partially obscured by another AR vehicle element 432. In various embodiments, tutoring application 205 may be configured to instruct user 110 to perform operations for capturing real-world objects, and thus simulate-capture the interactive scene containing video data of moving AR elements (e.g., AR vehicle element 431 and AR vehicle element 432 are moving) and simulate-capture a set of frames for AR vehicle element 431 with various parts of AR vehicle element 431 obscured by AR vehicle element 432. In an example embodiment, when sufficient data about AR vehicle element 431 has been simulate-captured, tutoring application 205 may inform user 110 via interface 210 that simulate-capturing video data of moving AR vehicle element 431 can be completed. In some embodiments, during simulate-capturing of AR vehicle element 431, application 205 may instruct user 110 to change orientation and/or position of capturing device 162, zoom in/out of the AR element that is being simulate-captured, and/or move capturing device 162 to track the motion of AR vehicle element 431.

Tutoring application 205 may be configured to teach a user 110 how to effectively position and orient capturing device 162 for capturing real-world objects (e.g., a vehicle), by simulate-capturing an interactive scene containing AR elements. The AR elements may be based on the type of real-world objects (e.g., sports car, sports utility vehicle, van, boat, etc.) or environmental factors (e.g., lighting, visibility, etc.) that may be presented during the real-life capturing process. In an example embodiment, an AR element may be successfully simulate-captured from a side of the AR element (e.g., AR vehicle element 310); however, a likelihood of successfully simulate-capturing AR vehicle element 310 may increase if the element 310 is simulate-captured from the driver's front-side position as indicated by the position relative to AR vehicle element 310 in FIG. 4C. Several different positions may be preferred for simulate-capturing element 310. For example, in addition to the front-side position, capturing vehicle element 310 image from the front of the vehicle or from the back of vehicle element 310 may increase the likelihood of vehicle element 310 being recognized by analysis module 214. Interface 190 of tutoring application 205 may use various means (e.g., arrows, messages on the screen of device 120, audio messages, and/or the like) to guide user 110 to correctly orient and position capturing device 162 for training user how to simulate-capture an AR element representing a real-world object, such as a vehicle.

In an example embodiment, AR vehicle element 310 may be successfully simulate-captured from various perceived distances to element 310, when element 310 is placed within an interactive scene; however, a likelihood of successfully simulate-capturing element 310 may increase if the element 310 is simulate-captured from a perceived distance that may range, for example, between five to fifty feet. In should be noted that most appropriate perceived distance for simulate-capturing element 310 may depend on size of element 310, type of element 310 (e.g., type of vehicle represented by element 310), type and quality of capturing device 162, a zooming capability of device 162 and the like. The perceived distance to element 310 may be inferred from the size of element 310 relative to various elements (e.g., elements corresponding to real-world objects) of the interactive scene. User 110 may move client device 120 through physical space of user 110 environment and simulate approaching element 310 or moving away from element 310, thus changing the perceived distance to element 310. Interface 190 of tutoring application 205 may use various means (e.g., arrows, messages on the screen of device 120, audio messages, and/or the like) to guide user 110 to correctly position capturing device 162 for training user how to simulate-capture an AR element at the perceived distance to the AR element that is appropriate for capturing the AR element.

Interface 190 of tutoring application 205 may be configured to record a simulate-capturing process. For example, interface module 210 may be configured to record all/some of the steps taken by user 110 to simulate-capture an AR element that may represent a real-world object. Moreover, interface 190 may be configured to record parameters of an environment of the tutoring session for user 110. For example, tutoring application 205 may be configured to record the lighting conditions for user 110 during the tutoring sessions or real-world capturing session. Tutoring application 205 may be also configured to record the type of surroundings during the tutoring sessions or real-world capturing session, and/or the like. In some embodiments, tutoring application 205 may run on a background and may be configured to record lighting conditions for user 110 when user 110 uses capturing device 162 to capture various images that may not be related to real-world capturing/tutoring sessions. The recorded information may be used to set default optimal parameters for capturing device 162 during a prospective real-world capturing session, as well as use these optimal parameters when training user 110 via tutoring application 205. For example, if user 110 is generally conducting real-world capturing sessions in the evening, parameters for capturing device 162 may be adjusted accordingly to provide adequate image resolution for captured real-world objects (e.g., adjusting shutter speed, level of sensitivity of capturing device 162 to available light, etc.) during real-world capturing sessions or tutoring sessions. In addition to setting parameters for capturing device 162, tutoring application 205 may provide recorded tutoring sessions to user 110 as a guide for reminding user 110 of various steps that might need to be taken for capturing an AR element that may represent a real-world object.

Information about user 110, client device 120, user 110 surroundings, and user 110 preferences during tutoring sessions may be collected by interface 190 and stored in a user profile. Information in the user profile may be available to the real-life object capturing and object recognition application.

In various embodiments, after simulate-capturing image data related to the interactive scene containing an AR element, analysis module 214 shown in FIG. 2 may be used to analyze the data to recognize attributes of the simulate-captured AR element (e.g., AR vehicle element 310 shown in FIG. 4C) and to assign a match score that indicates a probability of successful recognition of the attributes of the simulate-captured AR element. For example, if analysis module 214 estimates that AR vehicle element 310 is being recognized with a ninety percent certainty, the match score may be calculated to be 0.9. Thus, the match score may be a probability value associated with the AR element recognition. Alternatively, the match score can be a function (e.g., a one-to-one function) related to a probability value associated with the AR element recognition (e.g., for the probability of 0.9, the match score may be 90). As used herein, the term "match score" "recognition probability" or "likelihood" of correspondence of an AR element to a data record related to attributes of the simulate-captured AR element may be used interchangeably throughout this disclosure.

In various embodiments, tutoring application 205 may determine a position of the AR element relative to GUI component 170 and provide, based on the determined position, an indication of whether the simulate-capturing the interactive scene may be successful. For example, if the AR element in its entirety is positioned within GUI component 170 and occupies a large portion of GUI component 170 (e.g., the AR element occupies fifty percent or more of the area of GUI component 170), then tutoring application 205 may provide an indication that simulate-capturing of the interactive scene may be successful. The indication may be any suitable audio/video or image data that can be presented to user 110 by tutoring application 205 via client device 120 (e.g. an image on screen 140, an audio signal, etc.). In various embodiments, the indication may be presented to user 110 prior to user 110 simulate-capturing the AR element, while in other embodiments, the indication may be presented to user 110 after user 110 completed simulate-capturing the AR element. In various embodiments, the position of the AR element relative to GUI component 170 may be one of the factors that may determine whether the simulate-capturing of the interactive screen may be successful. Additionally, or alternatively, determining an orientation of the AR element relative to a viewpoint for the interactive scene may also influence the success of simulate-capturing the interactive scene. For example, as described above, the likelihood of successful simulate-capturing may increase if the AR element such as element 310 is simulate-capturing from the driver's front-side position as indicated by the position relative to AR vehicle element 310 in FIG. 4C.

Analysis module 214 may be configured to determine, based on the match score (or the indication from tutoring application 205 as described above), various ways to manipulate the interactive scene. For example, if the match score is below an acceptable threshold, a second attempt at simulate-capturing an AR element may be required. An acceptable threshold may be sufficiently high to provide user 110 and/or tutoring application 205 with sufficient confidence that the simulate-captured AR element has been recognized (e.g., the threshold may be larger than sixty percent, seventy percent, eighty percent, or ninety percent). If the match score is below the acceptable threshold, analysis module 214 may indicate, via interface 190, required changes to the image capturing process to improve the quality of the simulate-captured image/video data in order to increase the match score. For example, tutoring application 205 may indicate that user 110 should use device 120 manipulations that include moving a viewpoint towards the vehicle, moving the viewpoint relative to the vehicle, simulate-capturing vehicle using different parameters, and/or the like.

Alternatively, if a calculated match score is above the threshold, or if tutoring application 205 is determined that the match score cannot be improved (e.g., the match score does not improve or improves insignificantly with one or more consecutive attempts for simulate-capturing an AR element), tutoring application 205 may terminate the tutoring session or may not identify further manipulations for the interactive scene. In some embodiments, tutoring application 205 may provide the match score to user 110 after a simulate-capturing attempt and/or may indicate to user 110 that an AR element, such as AR vehicle element 310, has been successfully recognized.

In various embodiments, analysis module 214 may interact with remote computing system 250 to facilitate adequate recognition of an AR element. Even though tutoring application 205 may include detailed information about the AR element (e.g., tutoring application 205 may include complete information about AR vehicle element 310, such as vehicle make, model, year, trim, etc.), the information may intentionally not be used for the purposes of recognizing the AR element in order to correctly evaluate the match score for image data related to simulate-capturing the AR element. Thus, the match score for the simulate-captured AR element may be calculated using the same approach as used for calculating the match score for image data obtained by capturing the real-world object. In an example embodiment, module 214 may communicate the image/video data to remote computing system 250.

Remote computing system 250 may include one or more computing systems configured to perform operations consistent with identifying vehicle images. In some embodiments, system 250 may be associated with a cloud computing service such as Microsoft Azure™ or Amazon Web Services™. Remote computing system 250 may receive a request to identify an image from client devices 120. The request may include an image of a vehicle and, in some cases, the request may include a video file or a streaming video feed.

Referencing FIG. 2, remote computing system 250 may include one or more computing devices 268 and one or more memory devices 270. Computing device 268 may be a processor for executing the programming instructions, such as a central processing unit (CPU) or a special-purpose computing device, graphical processing unit (GPU), a field-programmable gate array (FPGA), or application-specific integrated circuit. Computing device 268 may include one or more computer clusters having a plurality of computing devices communicating with each other. For example, in some embodiments, a computer cluster may be a group of processors in communication through fast local area networks. In other embodiments, a computer cluster may be an array of graphical processing units configured to work in parallel as a GPU cluster. In such embodiments, a computer cluster may include heterogeneous or homogeneous hardware. In some embodiments, a computer cluster may include a GPU driver for each type of GPU present in each cluster node, a Clustering API (such as the Message Passing Interface, MPI), and VirtualCL (VCL) cluster platform such as a wrapper for OpenCL™ that allows most unmodified applications to transparently utilize multiple OpenCL devices in a cluster. In yet other embodiments, a computing cluster may operate with distcc (a program to distribute builds of C, C++, Objective C or Objective C++ code across several machines on a network to speed up building), and MPICH (a standard for message-passing for distributed-memory applications used in parallel computing), Linux Virtual Server™, Linux-HA™, or other director-based clusters that allow incoming requests for services to be distributed across multiple cluster nodes.

Memory device 270 may include a non-transitory computer-readable storage medium for storing programming instructions. The computer-readable storage medium may be, for example, but is not limited to, an electronic storage device, a magnetic storage device, an optical storage device, an electromagnetic storage device, or any suitable combination of the foregoing. A non-exhaustive list of more specific examples of the computer-readable storage medium may include a hard disk, a random access memory (RAM), a read-only memory (ROM), an erasable programmable read-only memory (EPROM or Flash memory), a static random access memory (SRAM), a portable compact disc read-only memory (CDROM), a digital versatile disk (DVD), a memory stick, or/and the like.

Program instructions stored on a computer-readable storage medium may include assembler instructions, machine dependent instructions, firmware instructions, source code or object code written in any combination of one or more programming languages, including an object oriented programming languages, procedural programming languages or functional programming languages. The programming language may be Fortran, Lisp, C++ or the like. The program instructions may be executed by one or more computing devices 268.

In various embodiments, server 260 may include computer-implemented methods (i.e., programming instructions) for exchanging information with tutoring application 205. The computer-implemented methods may be executed, for example, by at least one computing device 268. As described above, server 260, database 262, data processing module 264 and data generation module 266 may be software applications that may use one or more computing devices 268 and one or more storage devices 270. In various embodiments, object data (e.g., data related to real-world object such as vehicles) may be collected on an ongoing basis by a software application of database 262 of system 250 to compile the data for database 262. In some embodiments, the data may be collected by visiting vehicle related websites (e.g., websites associated with car manufacturers and/or car dealers).

Data processing module 264 of remote computing system 250 may be used to process images of the captured real-world objects as well as AR elements representing the real-world objects received from client device 120 and recognize attributes of these images using artificial intelligence algorithms executed by one or more computing devices 268 used by data processing module 264.

Remote computing system 250 may include one or more databases 262 that may contain data related to real-world objects being recognized by tutoring application 205. For example, database 262 may contain vehicle images, and vehicle attributes (e.g., model, make, year, and trim). Database 262 may include, for example, Oracle™ databases, Sybase™ databases, or other relational databases or non-relational databases, such as Hadoop™ sequence files, HBase™, or Cassandra™. Database 262 may include software components (e.g., database management system, database server, etc.) configured to receive and process requests for data stored in storage devices 270 of system 250 and to provide data from the database. Database 261 may be configured to collect and/or store data associated with real-world objects (e.g. vehicles) and provide the data to client device 120 upon relating the captured vehicle to the stored data.

Data processing module 264 may include one or more software applications that collect images of captured real-world objects and process them to train an object recognition model. The recognition model may include convolutional neural networks that determine attributes of the captured real-world object based on extracted parameters. However, the object recognition model may also include a regression model that estimates relationships between input and output variables. The object recognition model may additionally sort elements of a dataset using one or more classifiers to determine the probability of a specific outcome. The object recognition model may be a parametric, non-parametric, and/or semi-parametric model.

In some embodiments, the object recognition model may include an input layer and an output layer connected via nodes with different activation functions as in a convolutional neural network. "Layers" in the neural network may transform an input variable into an output variable through a differentiable function. The convolutional neural network may include multiple distinct types of layers. For example, the network may include a convolution layer, a pooling layer, a ReLU Layer, a number filter layer, a filter shape layer, and/or a loss layer. Further, the convolution neural network may comprise a plurality of nodes. Each node may be associated with an activation function, and each node may be connected with other nodes via synapses that are associated with weights. The object recognition model may include one or more neural networks (also referred to as artificial neural networks). The neural networks may model input/output relationships of variables and parameters by generating a number of interconnected nodes which contain an activation function. The activation function of a node may define a resulting output of that node given an argument or a set of arguments. The object recognition model may also include Random Forests, composed of a combination of decision tree predictors. (Decision trees may comprise a data structure mapping observation about something, in the "branch" of the tree, to conclusions about that thing's target value, in the "leaves" of the tree.) Each tree may depend on values of a random vector sampled independently and with the same distribution for all trees in the forest. The object recognition model may additionally or alternatively include classification and regression trees, or other types of models known to those skilled in the art.

In various embodiments, data processing module 264 may complete an object recognition process by selecting a most probable data record corresponding to a vehicle identified within the image data that may correspond to a simulate-captured AR element, or to captured real-world object. For example, module 264 may select a most probable data record corresponding to captured image data of a real-world object. Module 264 may calculate a match score based on the selected most probable data record. In various embodiments, the match score may be communicated to tutoring application 205 and may be presented to user 110 via interface 190.

Remote computing system 250 may generate a data record corresponding to a captured real-life object or to a simulate-captured AR element using data generation module 266. For example, module 266 may generate a make, model, trim, year, mileage and any other relevant information about a vehicle. Such record may be communicated to tutoring application 205 and presented to user 110 via interface 190. In some embodiments, the data record may be presented to user 110 when a calculated match score is higher than a threshold value, and the data record may not be presented to user 110 when the match score is lower than the threshold value.

Figure 5:
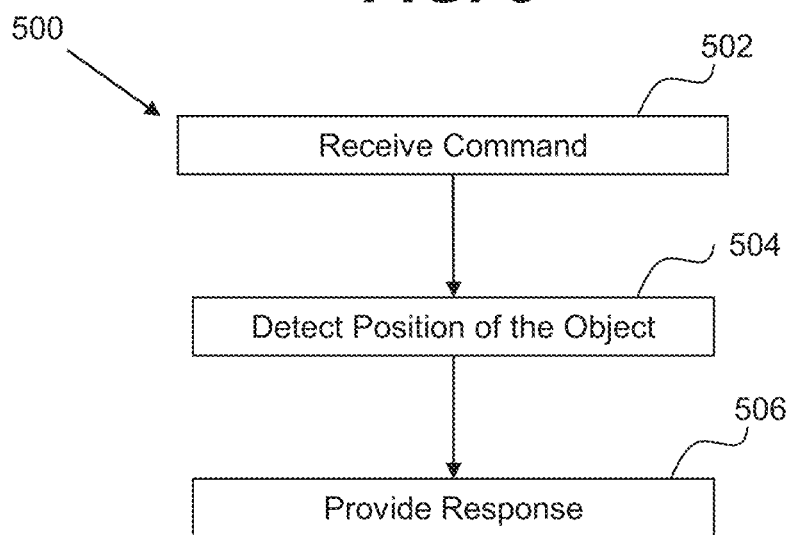
FIG. 5 is a flowchart of an illustrative process of training a user via a tutoring application, consistent with disclosed embodiments.

FIG. 5 shows a flowchart of an illustrative process 500 of training user 110 via tutoring application 205, consistent with disclosed embodiments. In an example embodiment illustrated by process 500, tutoring application 205 receives a command from user 110 to simulate-capture an AR element at step 502. The simulate-capture command may be completed by simulate-capturing the AR element. In an example embodiment, tutoring application 205 may provide simplified feedback to user 110 without communicating with remote system 250. For example, at step 504, tutoring application 205 may detect a position/orientation of an AR element (e.g., AR vehicle element 310 shown in FIG. 3) within screen 140. In an example embodiment, tutoring application 205 may check if AR vehicle element 310 is within GUI component 170, shown in FIG. 3. In an example embodiment, tutoring application 205 may obtain the match score without communicating with remote computing system 250. For example, tutoring application 205 may calculate the match score by determining a position of AR vehicle element 310 relative to a viewing area of the interactive scene and determining an orientation of element 310 relative to a viewpoint for the interactive scene. For example, the match score may be high if element 310 is located in its entirety within GUI component 170 and if element 310 is viewed from a preferred direction (e.g., from the viewpoint shown in FIG. 3 for AR vehicle element 310). In an example embodiment, the match score may not be high if element 310 is only partially located within GUI component 170 (e.g., as shown in FIG. 4A or 4B) or if it is viewed from a direction that may not be optimal for object recognition (e.g., from a viewpoint that is above element 310).

Tutoring application 205 may provide a response to user 110 as to whether an AR element (e.g., element 310) has been detected at step 506 of process 500. The response may be any suitable action that indicates to user 110 that the element 310 has been successfully detected at step 504. For example, the response may include providing user 110 with a data record of AR element 310 being recognized, providing the user with the match score and a brief description of the real-world object being recognized, or using any other visual or audio data informing the user that AR element 310 has been identified. Additionally, tutoring application 205 may inform user 110 that AR element 310 has not been identified via appropriate visual or audio response or provide user 110 no visual or audio response when AR element 310 is not recognized.

In various embodiments, in order to promote user 110 training, tutoring application 205 may be configured to initially display AR element 310 within the interactive scene at a predetermined position and orientation, resulting in a low match score calculated for the simulate-captured image/video data (or simulate-captured frame) of the interactive scene. The low match score may indicate that, if AR element 310 were to be simulate-captured by user 110, the simulation would fail (i.e., the AR element 310 would not be accurately recognized). For example, AR element 310 may be positioned as shown in FIG. 4A or 4B, or additional AR elements may be displayed that may obscure the view of AR elements being captured (e.g., elements 421 and 432, as respectively shown in corresponding FIGS. 4D and 4E). In various embodiments, the initial placement of AR element 310 may intentionally be sub-optimal so as to require user 110 to reorient client device 120 relative to AR element 310 to practice providing optimal capturing position, distance, and the like. In some cases, the initial placement of AR element 310 may require user 110 to move to a new position in order to adequately simulate-capture AR element 310 (e.g., to achieve a high match score when simulate-capturing AR element 310).

Figure 6:
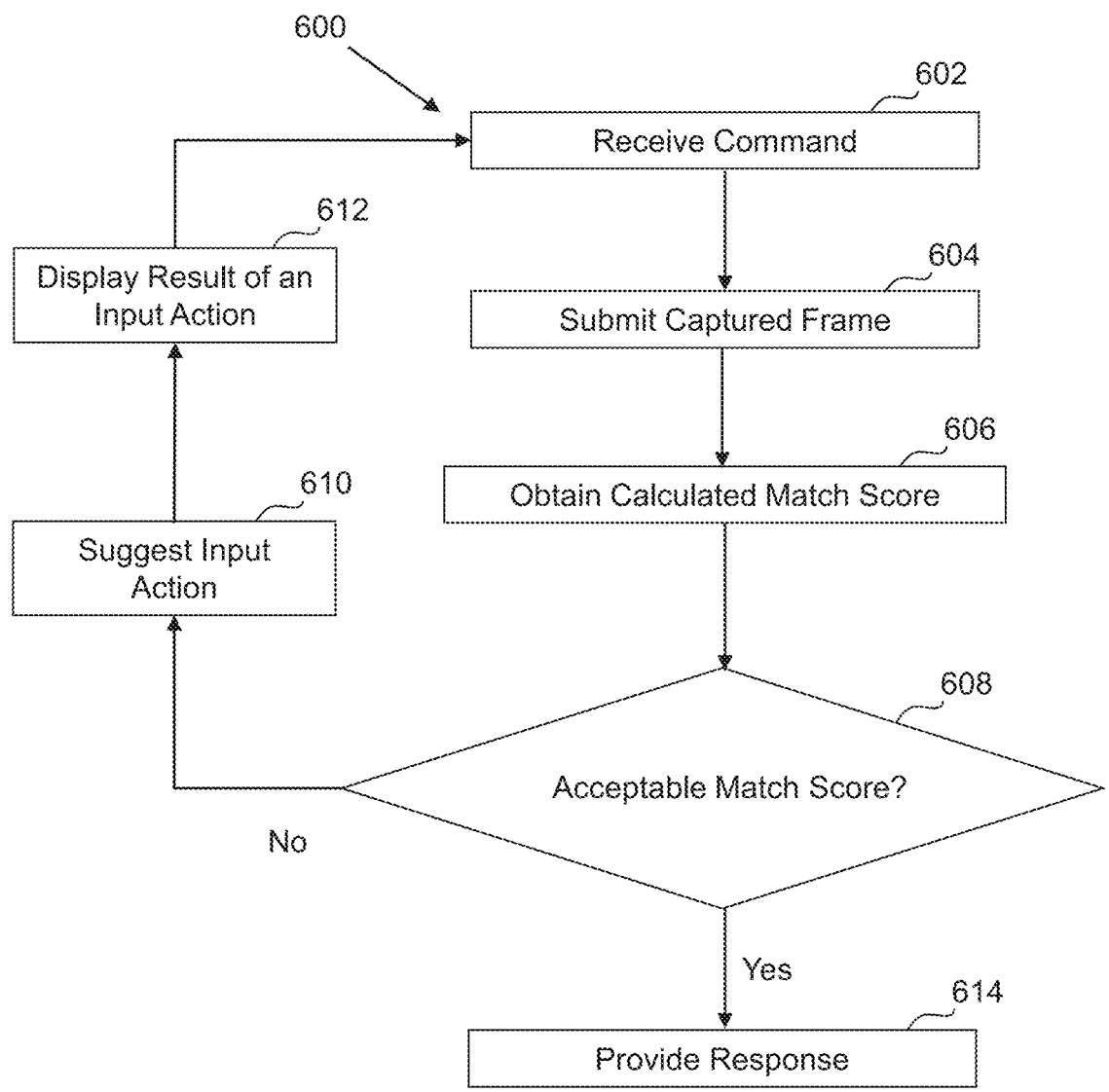
FIG. 6 is a flowchart of an illustrative process of analyzing a user input and providing a response to a user by a tutoring application, consistent with disclosed embodiments.

FIG. 6 is a flowchart of an illustrative process 600 of analyzing a user input and providing a response to user 110 by tutoring application 205, consistent with disclosed embodiments. At step 602 of process 600, tutoring application 205 receives a simulate-capture command from a user. Step 602 of process 600 may be the same as step 502 of process 500 shown in FIG. 5. At step 604, tutoring application 205 may submit simulate-captured image/video data to remote computing system 250 for further processing (e.g., for image recognition using object recognition model). Remote computing system 250 may attempt to recognize the simulate-captured AR element and calculate a match score describing a likelihood of the AR element being recognized. Tutoring application 205 may be configured to receive a match score from system 250 at step 606 and at step 608, compare the match score with an acceptable value for the match score. For example, application 205 may compare the match score with a predefined threshold. If the match score is lower than the threshold value (step 608, No), tutoring application 205 may suggest to user 110 a way to manipulate device 120 to improve the match score at step 610. The manipulation of device 120 may include moving away from the vehicle, approaching the vehicle, moving laterally relative to the vehicle, simulate-capturing the vehicle using different parameters, and/or the like. In various embodiments, the type of manipulation may be suggested using various visual or audio means (e.g., via on-screen messages, via arrow elements, or audio cues). In various embodiments, user 110 may manipulate device 120 in a way that may or may not be the suggested by tutoring application 205. As a result of user 110 manipulation, tutoring application 205 may be configured to display results related to such manipulation at step 612 of process 600. For example, application 205 may be configured to display a zoomed AR element, or the AR element observed from a different viewpoint.

After completion of step 612, tutoring application 205 may be configured to repeat steps 602-612. In an example embodiment, steps 602-612 may be repeated until the match score is below the threshold value as determined in step 608. If the match score is above the threshold value (step 608, Yes), tutoring application 205 may be configured to provide a response to the user at a step 614 that may be the same as the step 506 of process 500. It should be noted, that in an example embodiment, if the match score is below the threshold value (step 608, No) as determined in step 608, and the number of attempts to simulate-capture an AR element exceeds an allowed maximum number of the sessions (such a situation may be described as failure to simulate-capture the AR element), process 600 may proceed to step 614. For cases when simulate-capturing of AR element results in failure, tutoring application 205 may provide a response at step 614 that is different from the response provided to user 110 when AR element is determined to be simulate-captured with a sufficiently high match score (i.e., the match score being higher than the threshold value).

While steps 604 and 606 of process 600 describe tutoring application 205 communicating with remote computing system 250 to obtain the match score, in alternative embodiments, step 604 of process 600 may be omitted, and step 606 may include calculating the match score by tutoring application 205 without communicating with system 250.

In various embodiments, tutoring application 205 may be configured to receive a request from user 110 to display one or more AR elements. In an example embodiment, user 110 may select the types of AR elements to display. For example, user 110 may select AR element from a class of vehicles such as sedans, SUVs, vans, and/or the like. In some embodiments, user 110 may select some of the attributes of AR elements (e.g., color of a vehicle) to be displayed. A request to display one or more AR element is interpreted by application 205 as a command to retrieve data associated with one or more of the AR elements from a database. For example, application 205 may receive a request to retrieve data associated with the AR elements from database 262 of remote computing system 250. In various embodiments application 205 may proceed to retrieve data related to the AR elements from database 262 and render the AR elements on screen 140 of client device 120. In some embodiments, the request from user 110 to display one or more AR elements may be associated with a command to start tutoring session, and in various embodiments, displaying the AR elements may precede a request to simulate-capture the AR element and to recognize the AR element.

The foregoing description has been presented for purposes of illustration. It is not exhaustive and is not limited to precise forms or embodiments disclosed. Modifications and adaptations of the embodiments will be apparent from a consideration of the specification and practice of the disclosed embodiments. For example, while certain components have been described as being coupled to one another, such components may be integrated with one another or distributed in any suitable fashion.

Moreover, while illustrative embodiments have been described herein, the scope includes any and all embodiments having equivalent elements, modifications, omissions, combinations (e.g., of aspects across various embodiments), adaptations and/or alterations based on the present disclosure. The elements in the claims are to be interpreted broadly based on the language employed in the claims and not limited to examples described in the present specification or during the prosecution of the application, which examples are to be construed as nonexclusive. Further, the steps of the disclosed methods can be modified in any manner, including reordering steps and/or inserting or deleting steps.

The features and advantages of the disclosure are apparent from the detailed specification, and thus, it is intended that the appended claims cover all systems and methods falling within the true spirit and scope of the disclosure. As used herein, the indefinite articles "a" and "an" mean "one or more." Similarly, the use of a plural term does not necessarily denote a plurality unless it is unambiguous in the given context. Words such as "and" or "or" mean "and/or" unless specifically directed otherwise. Further, since numerous modifications and variations will readily occur from studying the present disclosure, it is not desired to limit the disclosure to the exact construction and operation illustrated and described, and accordingly, all suitable modifications and equivalents may be resorted to, falling within the scope of the disclosure.

Other embodiments will be apparent from a consideration of the specification and practice of the embodiments disclosed herein. It is intended that the specification and examples be considered as an example only, with a true scope and spirit of the disclosed embodiments being indicated by the following claims.

What is claimed is:

1. A device, comprising:
   a storage medium storing instructions; and
   at least one processor configured to execute the stored instructions to perform operations comprising:
      displaying on a display screen an interactive scene containing an augmented reality element;
      receiving a first input to change a display of the interactive scene;
      receiving a request to simulate the capturing of image data representing the interactive scene;
      simulating the capturing of the image data representing the interactive scene, wherein simulating the capturing of the image data comprises receiving a second input from a user, the second input comprising:
         the user orienting and positioning the display screen for placing the augmented reality element at least partially within a first graphical user interface element shown on the display screen and represented by a region having a boundary, and
         the user interacting with a second graphical user interface element for storing the image data; and
      providing, an indication of whether the simulation has succeeded, wherein the success is determined by:
         identifying a probability of determining an identity of the augmented reality element; and
         determining whether the probability is above a threshold value.

2. The device of claim 1, wherein the first input comprises at least one of zooming a viewpoint to the augmented reality element, rotating the viewpoint for the interactive scene, moving the viewpoint for the interactive scene, or changing lighting conditions of the interactive scene.

3. The device of claim 1, wherein the operations further comprise:
   receiving a request to retrieve the augmented reality element from a database; and retrieving the augmented reality element for from the database.

4. The device of claim 1, wherein displaying the interactive scene comprises displaying a view of an environment of a user.

5. The device of claim 1, wherein providing the indication of whether the simulation has succeeded comprises:
determining an orientation of the augmented reality element relative to a viewpoint for the interactive scene.

6. The device of claim 1, wherein identifying a likelihood the probability comprises using an artificial neural network.

7. The device of claim 1, wherein the augmented reality element corresponds to a virtual vehicle.

8. The device of claim 1, wherein the operations further comprise:
selecting an initial predetermined position and orientation for the augmented reality element within the interactive scene, wherein the predetermined position and orientation are selected to result in the unsuccessful simulation; and
providing an indication that the simulation has not succeeded.

9. The device of claim 1, wherein the operations further comprise:
displaying suggestions for manipulating the device based on the indication of whether the simulation of the capturing of the image data representing the interactive screen has succeeded.

10. The device of claim 1, wherein providing the indication of whether the simulation has succeeded further comprises:
determining a perceived distance to the augmented reality element relative to a viewpoint for the interactive scene.

11. A training method for using a device for object recognition, the method comprising:
displaying on a display screen an interactive scene containing an augmented reality element;
receiving a first input from a user for manipulating the device, the first input resulting in changes of how the interactive scene is displayed;
receiving a request to simulate the capturing of image data representing the interactive scene;
simulating the capturing of the image data representing the interactive scene, wherein simulating the capturing of the image data comprises receiving a second input from the user, the second input comprising:
the user orienting and positioning the display screen for placing the augmented reality element at least partially within a first graphical user interface element shown on the display screen and represented by a region having a boundary, and
the user interacting with a second graphical user interface element for storing the image data; and
providing, an indication of whether the simulation has succeeded, wherein the success is determined by:
identifying a probability of determining an identity of the augmented reality element; and
determining whether the probability is above a threshold value.

12. The method of claim 11, wherein the first input comprises at least one of zooming a viewpoint to the augmented reality element, rotating the viewpoint for the interactive scene, moving the viewpoint for the interactive scene, or changing lighting conditions of the interactive scene.

13. The method of claim 11, further comprising:
receiving a request to retrieve the augmented reality element from a database; and
retrieving the augmented reality element from the database.

14. The method of claim 11, wherein displaying on the display screen the interactive scene comprises displaying a view of an environment of a user.

15. The method of claim 11, wherein providing the indication of whether the simulation has succeeded comprises:
determining an orientation of the augmented reality element relative to a viewpoint for the interactive scene.

16. A device, comprising
a storage medium storing instructions; and
a processor configured to execute the stored instructions to perform operations comprising:
displaying on a display screen an interactive scene containing an augmented reality element;
receiving a first input from a user for manipulating the device, the first input resulting in changes of how the interactive scene is displayed;
receiving a request to simulate the capturing of image data representing the interactive scene;
providing, an indication of whether the simulation will be successful, wherein the success is determined by:
identifying a probability of determining an identity of the augmented reality element; and
determining whether the probability is above a threshold value; and
simulating the capturing of the image data representing the interactive scene, wherein simulating the capturing of the image data comprises receiving a second input from the user, the second input comprising:
the user orienting and positioning the display screen for placing the augmented reality element at least partially within a first graphical user interface element shown on the display screen and represented by a region having a boundary, and
the user interacting with a second graphical user interface element for storing the image data.

17. The device of claim 16, wherein the operations further comprise:
displaying suggestions for manipulating the device based on the indication of whether the simulation will be successful.

18. The device of claim 16, wherein providing the indication of whether the simulation will be successful comprises:
determining an orientation of the augmented reality element relative to a viewpoint for the interactive scene.

* * * * *

UNITED STATES PATENT AND TRADEMARK OFFICE
CERTIFICATE OF CORRECTION

PATENT NO. : 10,726,630 B1
APPLICATION NO. : 16/457858
DATED : July 28, 2020
INVENTOR(S) : Staevan Duckworth et al.

Page 1 of 1

It is certified that error appears in the above-identified patent and that said Letters Patent is hereby corrected as shown below:

In the Claims

Claim 3, Column 21, Line 1, "retrieving the augmented reality element for from the" should read --retrieving the augmented reality element from the--.

Claim 6, Column 21, Lines 10-11, "identifying a likelihood the probability" should read --identifying the probability--.

Signed and Sealed this
Tenth Day of November, 2020

Andrei Iancu
*Director of the United States Patent and Trademark Office*